(12) United States Patent
Chen et al.

(10) Patent No.: US 9,379,075 B2
(45) Date of Patent: Jun. 28, 2016

(54) SEMICONDUCTOR DEVICE WITH BUMP STOP STRUCTURE

(71) Applicant: TAIWAN SEMICONDUCTOR MANUFACTURING CO., LTD., Hsinchu (TW)

(72) Inventors: Jie Chen, New Taipei (TW); Hsien-Wei Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 74 days.

(21) Appl. No.: 14/166,531

(22) Filed: Jan. 28, 2014

(65) Prior Publication Data

US 2015/0214170 A1 Jul. 30, 2015

(51) Int. Cl.
*H01L 23/48* (2006.01)
*H01L 23/42* (2006.01)
*H01L 23/00* (2006.01)
*H01L 21/768* (2006.01)
*H01L 23/485* (2006.01)
*H01L 23/31* (2006.01)
*H01L 23/525* (2006.01)
*H01L 23/532* (2006.01)

(52) U.S. Cl.
CPC ............... *H01L 24/13* (2013.01); *H01L 21/768* (2013.01); *H01L 23/3114* (2013.01); *H01L 23/485* (2013.01); *H01L 24/05* (2013.01); *H01L 24/11* (2013.01); *H01L 23/525* (2013.01); *H01L 23/53295* (2013.01); *H01L 2224/11334* (2013.01); *H01L 2224/11849* (2013.01); *H01L 2224/13014* (2013.01); *H01L 2224/13023* (2013.01); *H01L 2224/13024* (2013.01); *H01L 2924/2064* (2013.01)

(58) Field of Classification Search
CPC ........ H01L 24/13; H01L 23/485; H01L 24/05
USPC .................... 257/739, 773, E23.02, E23.021
See application file for complete search history.

(56) References Cited

U.S. PATENT DOCUMENTS

| 9,013,038 B2* | 4/2015 | Chen ..................... H01L 24/11 257/734 |
| 9,048,149 B2* | 6/2015 | Lai ........................ H01L 24/05 |
| 2007/0184643 A1* | 8/2007 | Rinne ................ H01L 21/0272 438/612 |
| 2013/0187269 A1* | 7/2013 | Lin ....................... H01L 24/81 257/737 |

* cited by examiner

*Primary Examiner* — Robert Huber
(74) *Attorney, Agent, or Firm* — McDermott Will & Emery LLP

(57) ABSTRACT

A method for manufacturing semiconductor devices is provided. In the method, a conductive pad and a metal protrusion pattern are formed in a metallization layer. A passivation layer is conformally deposited over the metallization, and a protection layer is conformally deposited over the passivation layer. Further, a post-passivation interconnect structure (PPI) is conformally formed on the protection layer, and the PPI structure includes a landing pad region, a protrusion pattern over at least a portion of the landing pad region and a connection line electrically connected to the conductive pad. A solder bump is then placed on the landing pad region in contact with the protrusion pattern of PPI structure. A to semiconductor device with bum stop structure is also provided.

20 Claims, 5 Drawing Sheets

SEMICONDUCTOR DEVICE WITH BUMP STOP STRUCTURE

BACKGROUND

Consumer demand for smaller electronic devices has led to various miniaturization efforts in the field of semiconductor manufacturing. In the past decade, along with the increasing demand for the miniaturization in a semiconductor packaging industry, the structure of a package device has evolved from a pin insert type or a through hole mount type to a surface mount type, thereby increasing the mount density for a circuit board. However, increased pin count peripherally designed and arranged around the package device typically results in too short of a pitch of lead wire, yielding limitations of miniaturization on board mounting of the package device.

A chip packaged with wafer level chip scale packaging (WLCSP) technology provides a solution to the above limitations of miniaturization. The WLCSP is a technology in which a whole wafer is packaged and tested first, and then diced into individual chips, instead of the traditional process of assembling the package of each individual unit after wafer dicing. In a typical WLCSP, post-passivation interconnect (PPI) lines, such as redistribution lines (RDLs), are formed with bond pads on metal layers exposed on the surface of the respective chip. Electrical connections are made through bond pads to connect the chip to a package substrate or another die. As a result, the size of a chip after being packaged with the WLCSP is the same as that of the bare chip.

On top of the PPI structures, under-bump metallurgy (UBM) is traditionally formed around the bond pads, and solder balls are individually placed on the bond pads. However, since the formation of the UBM involves the UBM and an additional protection layer (e.g., a second polymer layer), to lower the manufacturing cost, the solder ball in the WLCSP is then directly placed on the bond pad of plain surface of the PPI structure so as to skip the UBM and an additional protection layer from the top surface of the PPI structure.

Nonetheless, in dropping a solder ball to a designated bond pad, the ball shift occurs due to the lack of physical boundary from the UBM to constrain the ball movement, which results in significantly increase in the failure of the reliability tests in the package device.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
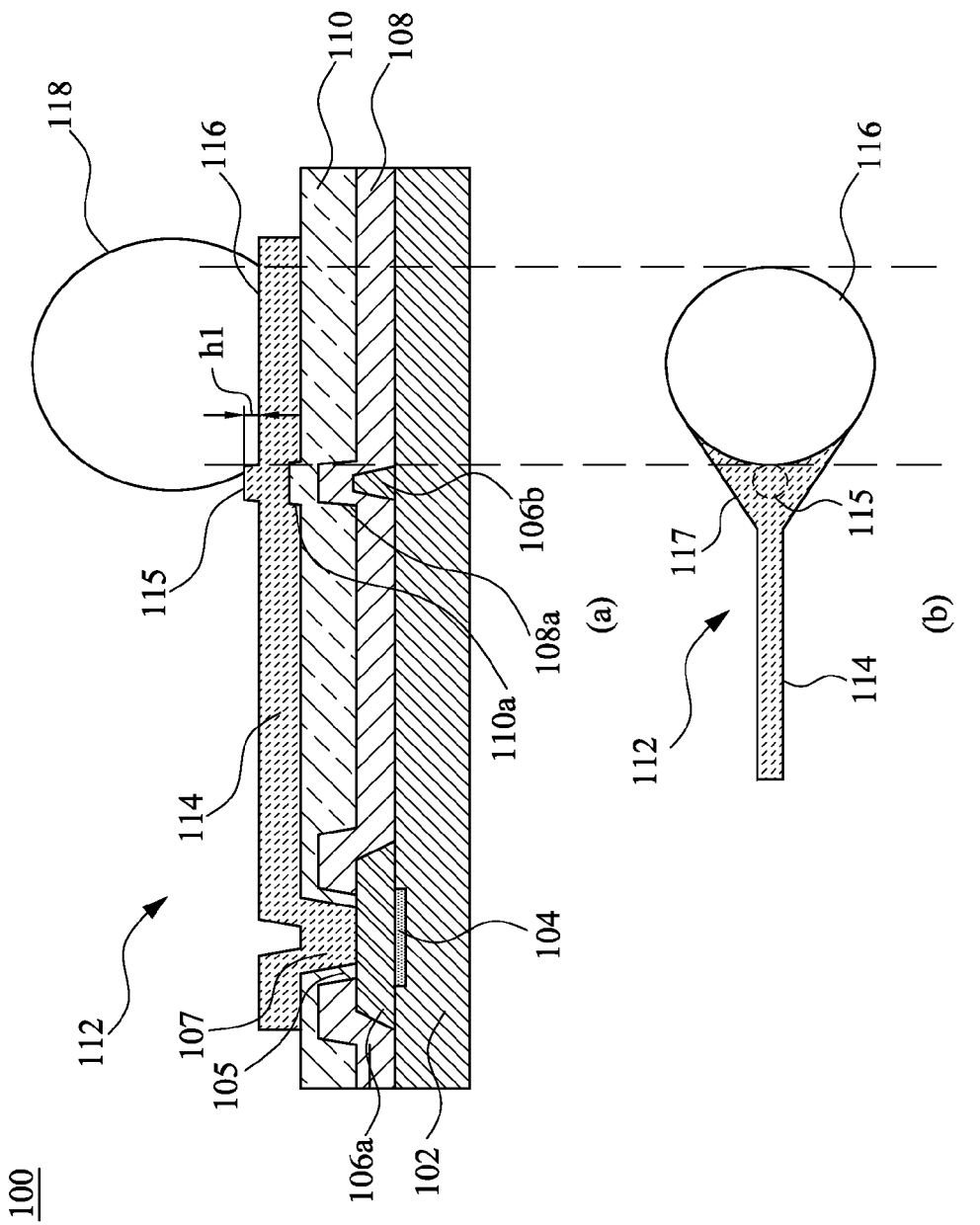
FIG. 1(a) is a cross-sectional view of a semiconductor device used for forming a bump structure on a PPI structure in accordance with various embodiments of the present disclosure.
FIG. 1(b) is schematic top view of the PPI structure of FIG. 1(a) having a conduction line and a landing pad region with a stud after the removal of a solder ball.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a silicon nitride layer includes embodiments having two or more such silicon nitride layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance in scaling down of modern integrated circuits. Concerning the miniaturization of semiconductor packaging, the WLCSP has been widely used to keep the packaged device in a size same as that before the package. As the solder balls is directly mounted on a desired pad area of a plain PPI structure, ball drop accuracy is limited due to no boundaries, e.g., the UBM, to constrain the movement of the solder ball in the placement of the solder ball. The worse ball mount accuracy results in the decrease in reliability inputs.

Novel designs in a semiconductor device to improve the ball drop accuracy are provided according to various embodiments of the present disclosure.

FIG. 1(a) is a cross-sectional view of a semiconductor device 100 in the wafer level chip scale package accordance with various embodiments of the present disclosure. The semiconductor device 100 includes a semiconductor substrate 102, a top metal line 104 overlying the semiconductor substrate 102, a conductive pad 106a and a protrusion pattern of metal layer 106b, a protection layer 110 overlying a passivation layer 108, and an post passivation interconnect (PPI) structure 112 on the protection layer 110. The passivation layer 108 and the protection layer 110 have a protrusion pattern of passivation layer 108a and a protrusion pattern of protection layer 110a, respectively, in which the protrusion pattern 110a is conformal to the protrusion pattern of metal layer 106b and so the protrusion pattern of passivation layer 108a in topography. The PPI structure 112 has a connection line 114 electrically connected to the conductive pad 106a, a landing pad region 116 and a protrusion pattern of PPI structure 115. In the semiconductor device 100, at least a portion of the protrusion pattern of PPI structure 114 overlaps an area of the landing pad region 116 adjacent to the connection line 114; a solder bump 118 is mounted on the bump pad region 116 and is in contact with the protrusion pattern of PPI structure 115.

According to various embodiments of the present disclosure, the semiconductor substrate 102 may include a variety of electrical circuits. The semiconductor substrate 102 may be a silicon substrate or a silicon-on-insulator substrate. An interlayer dielectric (ILD) layer, for example, of a low-K dielectric material, is formed on top of the substrate (not shown). The ILD layer may be formed, such as silicon oxide. Multiple metallization layers are formed over the ILD layer and formed of metal materials such as copper or copper alloys and the like. One or more inter-metal dielectric (IMD) layers and the associated metallization layers (not shown) are formed between the substrate 102 and the top metal line 104 of the metallization layer. Generally, the one or more IMD layers and the associated metallization layers are used to interconnect the electrical circuits in the substrate 102 to each other and to provide an external electrical connection. The TMD layers can be formed of a low-K dielectric material, such as FSG formed by PECVD techniques or high-density plasma CVD (HDPCVD), or the like, and can include intermediate etch stop layers. In embodiments, one or more etch stop layers (not shown) can be positioned between adjacent ones of the dielectric layers, e.g., the ILD layer and the IMD layers.

Referring to FIG. 1(a), the conductive pad 106a is formed from a metallization layer, so as to contact the top metal line 104, or electrically coupled to the top metal line 104 through a via. In embodiments, the conductive pad 106a can be formed of aluminum, aluminum copper, aluminum alloys, copper, copper alloys, or the like. To have the protrusion pattern of PPI structure 115, the protrusion pattern of metal layer 106b is formed along with the conductive pad 106a, such that the protrusion pattern of PPI structure 115 is conformal to the protrusion pattern of passivation layer 108a and the protrusion pattern of protection layer 110a, so conformal to the protrusion pattern of metal layer 106b in topography.

In various embodiments, the passivation layer 108 can be formed of a dielectric material, such as undoped silicate glass (USG), silicon nitride, silicon oxide, silicon oxynitride or a non-porous material by any suitable method, such as CVD, PVD, or the like. The passivation layer 108 can be a single layer or a laminated layer. One of ordinary skill in the art will appreciate that a single layer of conductive pad and a passivation layer are shown for illustrative purposes only. As such, other embodiments can include any number of conductive layers and/or passivation layers. The passivation layer 108 is then patterned by the use of masking methods, lithography technologies, etching processes, or combinations thereof, such that an opening is formed to expose a portion of conductive pad 106a. In some embodiment, the passivation layer 108 is patterned to cover the peripheral portion of the conductive pad 106a, and to expose the central portion of conductive pad 106a through the opening 105 of the passivation layer 108.

A protective layer 110 is formed on the passivation layer 108, and may fill the opening 105 in the passivation layer 108. The protective layer 110 is patterned to form another opening 107 through which at least a portion of the conductive pad 106a is exposed. According to various embodiments of the present disclosure, the protective layer 110 can be a polymer layer. For example, the polymer layer can be formed of a polymer material such as an epoxy, polyimide, benzocyclobutene (BCB), polybenzoxazole (PBO), and the like, although other relatively soft, often organic, dielectric materials can also be used. The formation methods of the protective layer 110 include spin coating or other methods.

Further, the post passivation interconnect (PPI) structure 112 is formed and patterned to electrically connect the conductive pad 106a. In some embodiments, the PPI structure 112 is formed on the protective layer 110 and electrically connected to the conductive pad 106a through the opening in the protective layer 110. The PPI structure 112 is a metallization layer, which may include, but not limited to, for example copper, aluminum, copper alloy, nickel or other mobile conductive materials using plating, electroless plating, sputtering, chemical vapor deposition methods, and the like. In some embodiments, the PPI structure 112 may further include a nickel-containing layer (not shown) on top of a copper-containing layer. In embodiments, the PPI structure 112 can also function as power lines, re-distribution lines (RDL), inductors, capacitors or any passive components. The PPI structure 112 includes the connection line 114 and the landing pad region 116. In embodiments, the connection line 114 and the landing pad region 116 can be formed simultaneously, and may be formed of a same conductive material. The connection line 114 extends to electrically connect the conductive pad 106a through the opening in the protective layer 110, and a protrusion pattern of PPI structure 115 is formed in a transition area 117 of the landing pad region 116 near the connection line 114, as shown in FIG. 1(b). A solder ball 108 is placed on the landing pad region 116, and is in contact with the protrusion pattern of PPI structure 115. The protrusion pattern of PPI structure 115 acts as a wetting stop, constraining the ball shift in the placement of a solder ball over a bond pad due to the undesired wetting of the solder ball. Through the routing of PPI structure 112, the landing pad region 116 may be, or may not be, directly over the conductive pad 106a.

FIG. 1(b) is schematic top view of a portion of the PPI structure 112 of FIG. 1(a) having a landing pad region 116 with the protrusion pattern of metal layer 115 in shape of a round stud, after the removal of a solder ball shown in FIG. 1(a), and a connection line 114. Two dash line across the FIGS. 1(a) and (b) illustrates two edges of the landing pad region 116 originally covered with the solder ball 118. Referring to FIG. 1(b), the protrusion pattern of PPI structure 115 is a round stud disposed within an area of the landing pad region 116 adjacent to the connection line 114, according to various embodiments of the present disclosure. In embodiments, the height h1 the stud of PPI 115 ranges from 1-3 µm. On a semiconductor die, there may be a plurality of the landing pad region 116 and the connection line 114.

In FIG. 1(b), the round stud of PPI structure 115 has the height h1 configured to prevent the solder ball 118 from wetting an undesirable area, e.g., the transition area 117, during the solder ball being mounted on the landing pad region 116. Accordingly, in the placement of the solder ball 118, the solder ball 118 accurately drops over the landing pad region 116 in aid of the round stud, as a curb, to the solder ball 118, and preventing the solder ball 118 from the wetting of the transition area 117 of the landing pad region 116 to the connection line 114 of the PPI structure 112, as shown in FIG. 1(b). It is noted that the stud may be in any shape, as long as the protrusion pattern of PPI capable of minimize the undesired wetting in mounting solder balls.

FIG. 2(a) is a cross-sectional view of a semiconductor device 200 in the wafer level chip scale package accordance with various embodiments of the present disclosure. The semiconductor device 200 includes a semiconductor substrate 202, a top metal line 204 overlying the semiconductor substrate 200, a conductive pad 206a and a protrusion pattern of metal layer 206b, a protection layer 210 overlying the passivation layer, and a PPI structure 212 on the protection layer 210. The passivation layer 208 and the protection layer 210 have a protrusion pattern of passivation layer 208a and a protrusion pattern of protection layer 210a, respectively, in which the protrusion pattern 210a is conformal to the protrusion pattern of metal layer 206b and so the protrusion pattern of passivation layer 208a in topography. The PPI structure 212 has a connection line 214 electrically connected to the conductive pad 206a, a landing pad region 216 and a protrusion pattern of PPI structure 215. In the semiconductor device 200, at least a portion of the protrusion pattern of PPI structure 214 overlaps an area of the landing pad region 216 adjacent to the connection line 214; a solder bump 218 is mounted on the bump pad region 216 and is in contact with the protrusion pattern of PPI structure 215.

Referring to FIG. 2(a), the conductive pad 206a is formed from a metallization layer, so as to contact the top metal line 204, or electrically coupled to the top metal line 204 through a via. To have the protrusion pattern of PPI structure 215, the protrusion pattern of metal layer 206b is formed along with the conductive pad 206a, such that the protrusion pattern of PPI structure 215 is conformal to the protrusion pattern of passivation layer 208a and the protrusion pattern of protection layer 210a, so conformal to the protrusion pattern of metal layer 206b in topography. One of ordinary skill in the art will appreciate that a single layer of conductive pad and a passivation layer are shown for illustrative purposes only. As such, other embodiments can include any number of conductive layers and/or passivation layers. The passivation layer 208 is patterned to cover the peripheral portion of the conductive pad 206a, and to expose the central portion of conductive pad 106a through the opening 205 of the passivation layer 208.

A protective layer 210 is overlying the passivation layer 208, and may fill the opening 205 in the passivation layer 208. The protective layer 210 is patterned to form another opening 207 through which at least a portion of the conductive pad 206a is exposed. According to various embodiments of the present disclosure, the protective layer 210 can be a polymer layer. For example, the polymer layer can be formed of a polymer material such as an epoxy, polyimide, benzocyclobutene (BCB), polybenzoxazole (PBO), and the like, although other relatively soft, often organic, dielectric materials can also be used. The formation methods of the passivation layer 208 and protective layer 210 may be the same as the embodiments disclosed in FIG. 1.

Further, the PPI structure 212 is formed and patterned to electrically connect the conductive pad 206a. In some embodiments, the PPI structure 212 is formed on the protective layer 210 and electrically connected to the conductive pad 206a through the opening in the protective layer 210. The PPI structure 212 is a metallization layer, which may include, but not limited to, for example copper, aluminum, copper alloy, nickel or other mobile conductive materials using plating, electroless plating, sputtering, chemical vapor deposition methods, and the like. The PPI structure 212 includes the connection line 214 and the landing pad region 216. In embodiments, the connection line 214 and the landing pad region 216 can be formed simultaneously, and may be formed of a same conductive material. The connection line 214 extends to electrically connect the conductive pad 106a through the opening in the protective layer 210, and a protrusion pattern of PPI structure 215 is formed in an area of the landing pad region 216 near the connection line 214, as shown in FIG. 2(b). The protrusion pattern of PPI structure 215 acts as a curb, constraining the ball shift in the placement of a solder ball over a bond pad due to the undesired wetting of the solder ball. Through the routing of PPI structure 212, the landing pad region 216 may be, or may not be, directly over the conductive pad 206a.

FIG. 2(b) is schematic top view of a portion of the PPI structure 212 of FIG. 2(a) having the connection line 214 and the landing pad region 216 with the protrusion pattern of metal layer 215 in shape of a rectangular stud, after the removal of a solder ball shown in FIG. 2(a). Referring to FIG. 2(b), the protrusion pattern of PPI structure 215 is the rectangular stud disposed across the area of the landing pad region 216 adjacent to the connection line 214, according to various embodiments of the present disclosure. In embodiments, the height h1 the stud of PPI 215 in FIG. 2(a) ranges from 1-3 µm. On a semiconductor die, there may be a plurality of the landing pad region 216 and the connection line 214. Two dash line across the FIGS. 2(a) and (b) illustrates the edges of the landing pad region 216 covered with the solder ball 218. In various embodiments, the rectangular stud of PPI structure 215 has the height h1 configured to prevent the solder ball 218 from wetting an undesirable area, e.g., the area 217. As shown in FIG. 2(b), a region 216a represents a potential wetting region of the solder ball 218 where the rectangular stud of PPI 215 is meant to separate from the connection line 214. In various embodiments, the rectangular stud of PPI structure 215 may have different dimensions, i.e., so in or across the transition region 217, to achieve the purpose of minimizing the wetting of the transition are 217 of the landing pad region 216, as shown in FIG. 2(b). Accordingly, in the placement of the solder ball 218, the solder ball 218 accurately drops over the landing pad region 216 in aid of the rectangular stud acting as a curb to the solder ball 218, and thus preventing the solder ball 218 from the wetting of an area of interested, which is normally the transition region from the landing pad region 216 to the connection line 214 of the PPI structure 212, as shown in FIG. 2(b). It is noted that the stud may be in any shape, as long as the protrusion pattern of PPI capable of minimize the undesired wetting in mounting solder balls.

Referring to FIG. 3(a), the conductive pad 306a is formed from a metallization layer, so as to contact the top metal line 304, or electrically coupled to the top metal line 304 through a via. In embodiments, the conductive pad 306a can be formed of aluminum, aluminum copper, aluminum alloys, copper, copper alloys, or the like. To have the protrusion pattern of PPI structure 315, the protrusion pattern of metal layer 306b is formed first along with the conductive pad 306a, such that the protrusion pattern of PPI structure 315 is conformal to the protrusion pattern of metal layer 306b in topography, so as conformal to the protrusion patterns of passivation layer 308a and protection layer 310a between the protrusion pattern of PPI structure 315 and the protrusion pattern of metal layer 306b.

Further, the PPI structure 312 is formed and patterned to electrically connect the conductive pad 306a. The PPI structure 312 includes the connection line 314 and the landing pad region 316, and a protrusion pattern of PPI structure 315. In contrast to the embodiments illustrated in FIGS. 1(a) and (b), the protrusion pattern of PPI structure 315 in FIGS. 3(a) and (b) is a continuous ring-shaped wall, across an transition area of the landing pad region 316 near the connection line 314 (not shown). In embodiments, the wall of PPI structure 315 is a continuous or non-continuous ring-shaped wall, or a continuous or non-continuous polygonal wall.

FIG. 3(b) is schematic top view of a portion of the PPI structure 312 of FIG. 3(a) having a continuous ring-shaped wall 315 after the removal of a solder ball shown in FIG. 3(a). Referring to FIG. 3(b), the protrusion pattern of PPI structure 315 is a continuous ring-shaped wall disposed around the landing pad region 316 and across an area of the landing pad region 316 adjacent to the connection line 314 according to various embodiments of the present disclosure. In embodiments, the height h1 of the wall of PPI 315 ranges from 1-3 μm. The protrusion pattern of PPI structure 315 acts as a wetting stop, in which the solder ball 318 evenly contacts the inner side of the wall of PPI 315, constraining the ball shift in the placement of the solder ball over the landing pad due to the undesired wetting of the solder ball.

As shown in FIG. 3(b), the diameter of the landing pad region 316 is D1, which is same as that of the inner edge of the ring-shaped wall 315. In various embodiments, D1 is limited in a range smaller than D2, where D2=D1×1.1.

Figure 4:
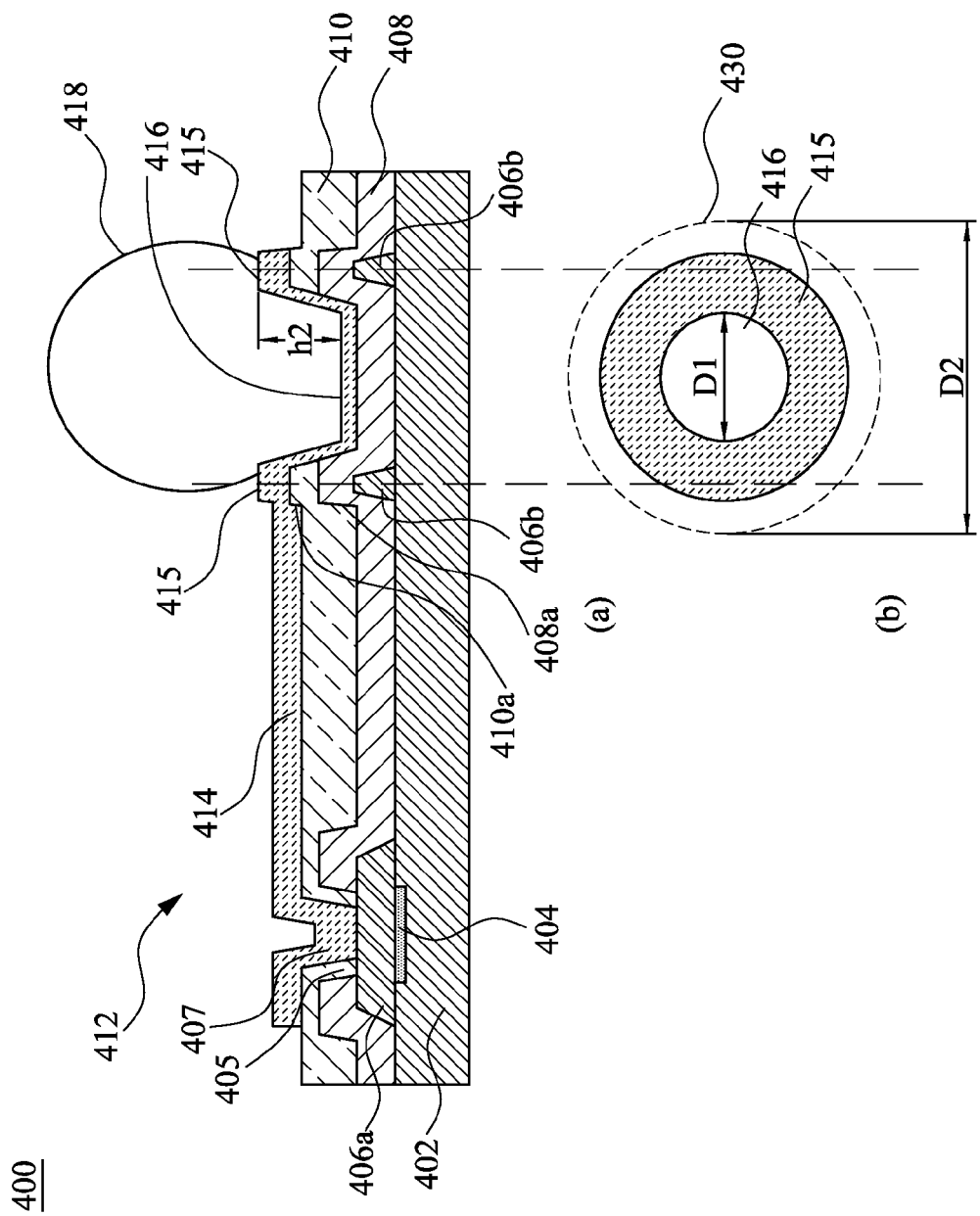
FIG. 4(a) is a cross-sectional view of a semiconductor device used for forming a bump structure on a PPI structure in accordance with various embodiments of the present disclosure.
FIG. 4(b) is schematic top view of the PPI structure of FIG. 4(a) having a landing pad region with a stud after the removal of a solder ball.

Referring to FIG. 4(a), the conductive pad 406a is formed from a metallization layer, so as to contact the top metal line 404, or electrically coupled to the top metal line 404 through a via. In embodiments, the conductive pad 306a can be formed of aluminum, aluminum copper, aluminum alloys, copper, copper alloys, or the like. To have the protrusion pattern of PPI structure 415, the protrusion pattern of metal layer 406b is formed first along with the conductive pad 406a, such that the protrusion pattern of PPI structure 415 is conformal to the protrusion pattern of metal layer 406b in topography, so as conformal to the protrusion patterns of passivation layer 408a and protection layer 410a between the protrusion pattern of PPI structure 415 and the protrusion pattern of metal layer 406b.

The PPI structure 412 is formed and patterned to electrically connect the conductive pad 406a. The PPI structure 412 includes the connection line 414 and the landing pad region 416, and a protrusion pattern of PPI structure 415 across an area of the landing pad region 416 near the connection line 414, as shown in FIG. 4(b). In contrast to the embodiments illustrated in FIGS. 3(a) and (b), the protrusion pattern (i.e., wall) of PPI structure 415 in FIGS. 4(a) and (b) is a continuous ring-shaped wall in the absence of an area of the protection layer 410 underneath the landing pad region 416. As such, according to some embodiments of the present disclosure, the wall of PPI 415 has a height h2 in a range from 5-15 μm. In embodiments, the wall of PPI structure 415 is a continuous or non-continuous ring-shaped wall, or a continuous or non-continuous polygonal wall. The deep wall of PPI structure 415 acts as a wetting barrier, in which the solder ball 418 evenly and firmly supported by the inner side of the wall of PPI 415, constraining the ball shift in the placement of the solder ball over the landing pad due to the undesired wetting of the solder ball.

As shown in FIG. 4(b), the diameter of the landing pad region 416 is D1, which is same as that of the inner edge of the ring-shaped wall 415. In various embodiments, D1 is limited in a range smaller than D2, where D2=D1×1.1.

Figure 5:
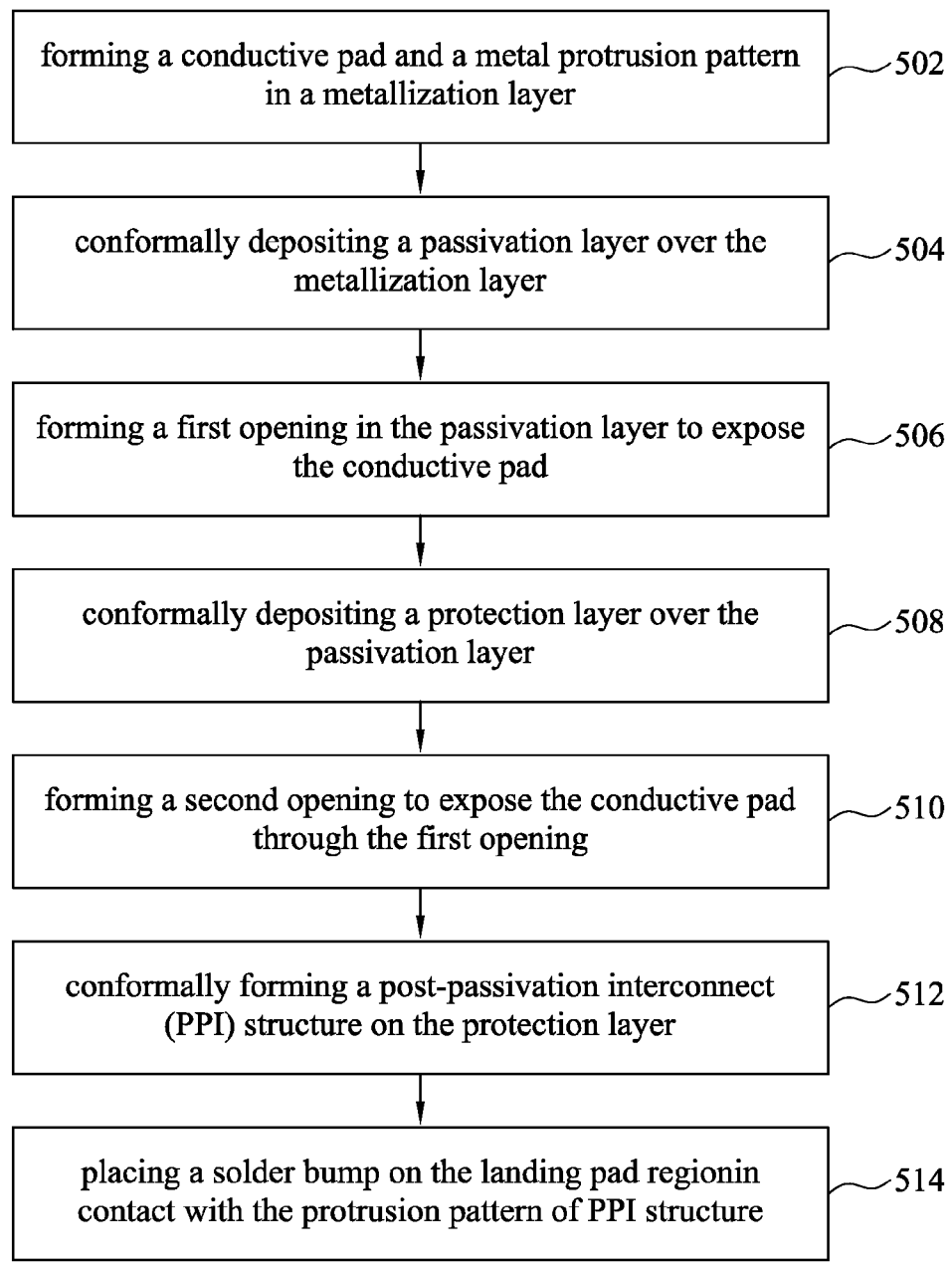
FIG. 5 is a flow chart of a method of making a semiconductor in accordance with various embodiments of the present disclosure.

FIG. 5 is a flowchart of a method 500 of making a semiconductor in accordance with various embodiments of the present disclosure. It is understood that additional processes may be provided before, during, and after the method 500 of FIG. 5, and that some other processes may only be briefly described herein. In operation 502, a conductive pad and a metal protrusion pattern is formed in a metallization layer. As shown in FIG. 1(a), the semiconductor substrate 102 may include a variety of electrical circuits, and a top metal line 104 overlying the semiconductor substrate 102. According to various embodiments of the present disclosure, the semiconductor substrate 102 may include a variety of electrical circuits. The semiconductor substrate 102 may be a silicon substrate or a silicon-on-insulator substrate. An interlayer dielectric (ILD) layer, for example, of a low-K dielectric material, is formed on top of the substrate (not shown in FIG. 1(a)). The ILD layer may be formed, such as silicon oxide. Multiple metallization layers are formed over the ILD layer and formed of metal materials such as copper or copper alloys and the like. One or more inter-metal dielectric (IMD) layers and the associated metallization layers (not shown) are formed between the substrate 102 and the top metal line 104 of the metallization layer.

Further in operation 502, referring to FIG. 1(a), a conductive pad 106a and a protrusion pattern of metal layer 106b are patterned from the metallization on the substrate 102 with the top metal line 104.

In operation 504, a passivation layer is conformally deposited over the metallization layer. The passivation layer has a protrusion pattern of passivation layer which is conformal to the topography of the protrusion pattern of metal layer. Referring to FIG. 1(a), the passivation layer 108 is applied covering the conductive pad 106a and the protrusion pattern of metal layer 106b of the metallization layer. In operation 506, a first opening 105 is formed in the passivation layer 108 to expose the conductive pad 106a. The passivation layer has a protrusion pattern of passivation layer 108a which is conformal to the topography of the protrusion pattern of metal layer 106b. In various embodiments, the passivation layer 108 can be formed of a dielectric material, such as undoped silicate glass (USG), silicon nitride, silicon oxide, silicon oxynitride or a non-porous material by any suitable method, such as CVD, PVD, or the like. The passivation layer 108 can be a single layer or a laminated layer. In some embodiment, the passivation layer 108 is patterned to cover the peripheral portion of the conductive pad 106a, and to expose the central portion of conductive pad 106a through the opening 105 of the passivation layer 108.

In operation 508, a protection layer is conformally deposited over the passivation layer, and a second opening is formed to expose the conductive pad through the first opening. The protective layer has a protrusion pattern of protection layer which is conformal to the topography of the protrusion pattern of the passivation layer. Referring to FIG. 1(a), the protection layer 110 is applied overlying the passivation layer 108. In operation 510, a second opening 107 is formed to expose the conductive pad 106a through the first opening 105. The protective layer 110 has a protrusion pattern of protection layer 110a which is conformal to the topography of the protrusion pattern of the passivation layer 108a. The formation methods of the protective layer 110 include spin coating or other methods.

In operation 512, a post-passivation interconnect (PPI) structure is conformally formed on the protection layer. The formed PPI structure has a connection line electrically connected to the conductive pad, a bond pad region and a protrusion pattern of PPI structure which is conformal to the topography of the protrusion pattern of protection layer. At least a portion of the protrusion pattern of PPI structure overlaps an area of the bond pad region adjacent to the connection line. Referring to FIGS. 1(a)-(b), 2(a)-(b) and 3(a)-(b), the PPI structure 112 (212) is formed on the protective layer 110 (210, 310) and electrically connected to the conductive pad 106a (or 206a, 306a) through the opening in the protective layer 110 (210, 310). The connection line 114 (214, 314) extends to electrically connect the conductive pad 106a through the opening in the protective layer 110 (210, 310), and a protrusion pattern of PPI structure 115 (215, 315) is formed in a transition area 117 (217) of the landing pad region 116 (216, 316) near the connection line 114 (214, 314). The protrusion pattern of PPI structure is a round stud 115, a rectangular stud 215, or a continuous ring-shaped wall 315, and the like, which is located in or across a transition area 117 (217, but shown in FIG. 3(b)) according to various embodiments of the present disclosure.

Figure 2:
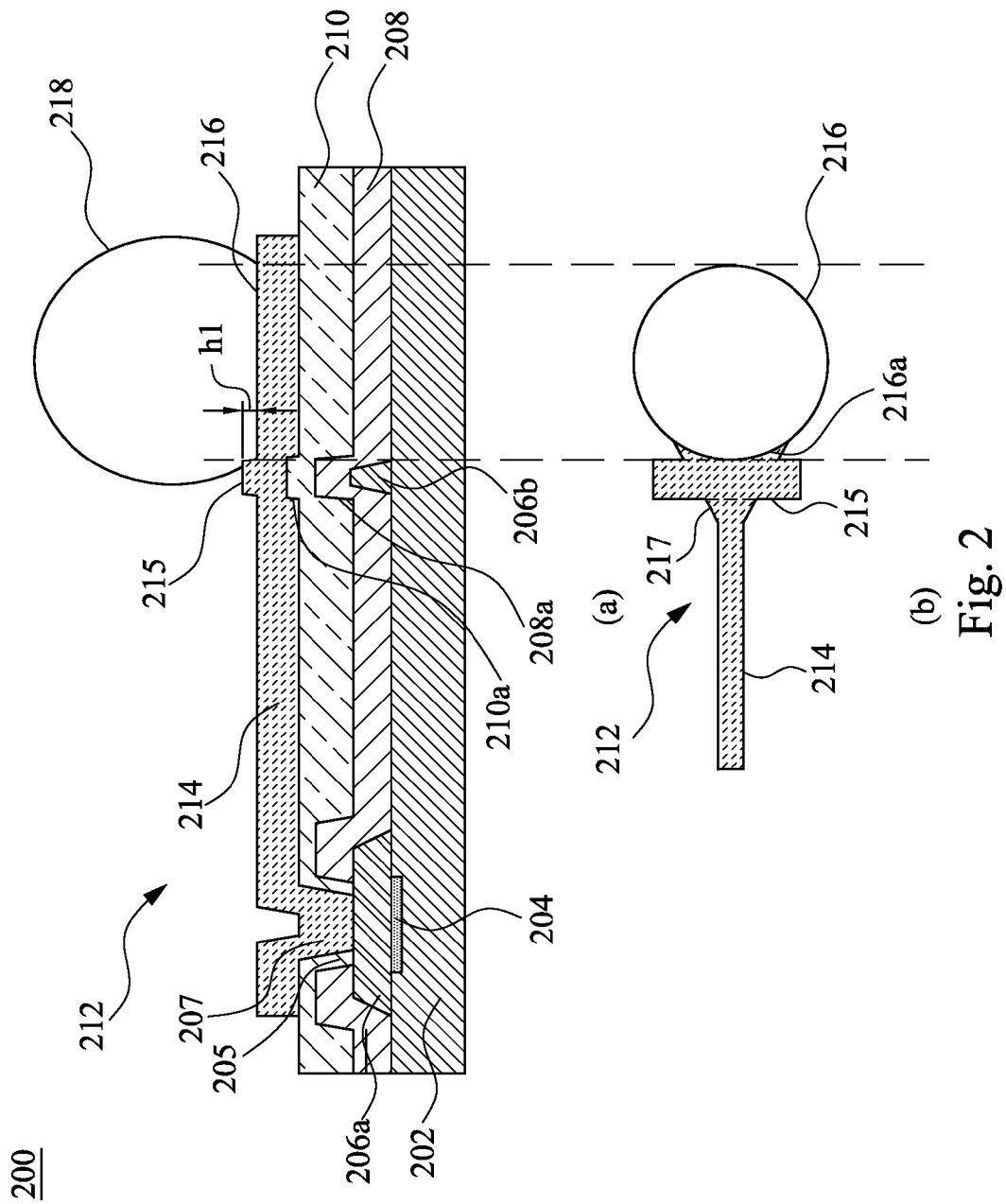
FIG. 2(a) is a cross-sectional view of a semiconductor device used for forming a bump structure on a PPI structure in accordance with various embodiments of the present disclosure.
FIG. 2(b) is schematic top view of the PPI structure of FIG. 2(a) having a connection line and a landing pad region with a stud after the removal of a solder ball.
Figure 3:
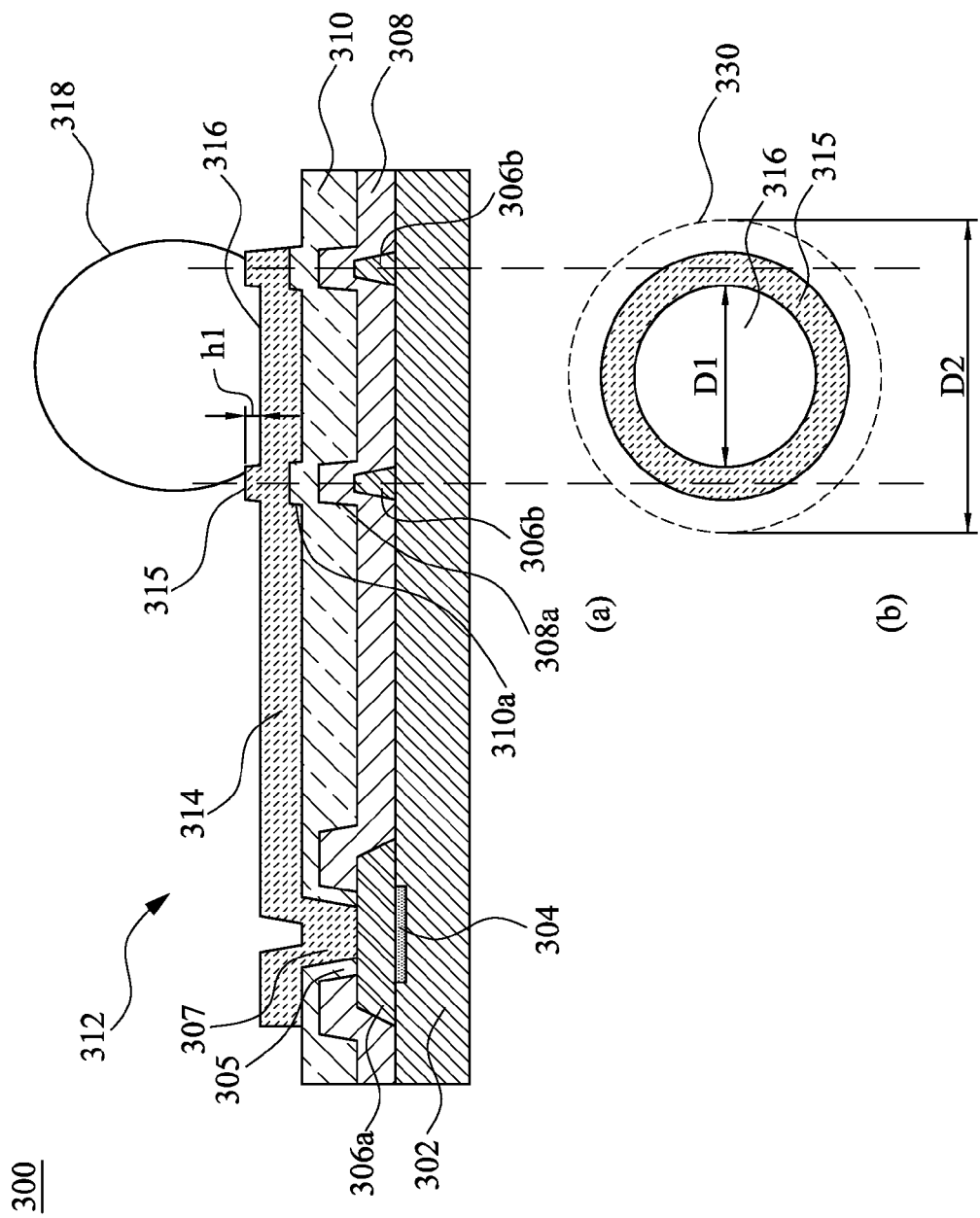
FIG. 3(a) is a cross-sectional view of a semiconductor device used for forming a bump structure on a PPI structure in accordance with various embodiments of the present disclosure.
FIG. 3(b) is schematic top view of the PPI structure of FIG. 3(a) having a landing pad region with a stud after the removal of a solder ball.

In operation 514, a solder bump is placed on the landing pad region and the solder bump in contact with the protrusion pattern of PPI structure. Referring to FIGS. 1-3, a solder ball 108 is dropped on the landing pad region 116 (216, 316), and is in contact with the protrusion pattern of PPI structure 115 (215, 315).

According to various embodiments of the present disclosure, operations 508 and 512 may further include operations. After the deposition of the protection layer, a pad region of the protection layer surrounded by the wall of passivation layer and the wall of the protection layer is formed. Accordingly, a bottom area of the passivation layer is exposed from the protection layer. Further, the wall of PPI structure is formed overlying the wall of protection layer and the bottom area of the passivation layer, which the wall of PPI structure has a height h2 to accommodate the solder bump. Referring to FIG. 4(a), the PPI structure 412 includes the connection line 414 and the landing pad region 416, and the continuous ring-shaped wall of PPI structure 415 across an area of the landing pad region 416 near the connection line 414, as shown in FIG. 4(b). The area of the protection layer 410 underneath the landing pad region 416 is absent. According to some embodiments of the present disclosure, the wall of PPI 415 has a height h2 in a range from 5-15 µm. In embodiments, the wall of PPI structure 415 is a continuous or non-continuous ring-shaped wall, or a continuous or non-continuous polygonal wall. The deep wall of PPI structure 415 acts as a wetting barrier, in which the solder ball 418 evenly and firmly supported by the inner side of the wall of PPI 415, constraining the ball shift in the placement of the solder ball over the landing pad due to the undesired wetting of the solder ball.

In various embodiments of the present disclosure, a method for manufacturing semiconductor devices is provided. In the method, a conductive pad and a metal protrusion pattern are formed in a metallization layer. A passivation layer is conformally deposited over the metallization, and a first opening is formed in the passivation layer to expose the conductive pad. A protection layer is then conformally deposited over the passivation layer, and a second opening is formed to expose the conductive pad through the first opening. Further, a PPI structure is conformally formed on the protection layer, and the PPI structure includes a landing pad region, a protrusion pattern over at least a portion of the landing pad region and a connection line electrically connected to the conductive pad. A solder bump is then placed on the landing pad region in contact with the protrusion pattern of PPI structure. A semiconductor device with bum stop structure is also provided.

In various embodiments of the present disclosure, a semiconductor device includes a semiconductor substrate, a metallization layer over the semiconductor substrate, a passivation layer over the metallization layer, a protection layer over the passivation layer, a PPI structure on the protection layer, a solder bump on the landing pad region in contact with the protrusion pattern of PPI structure. The metallization layer has a conductive pad and a metal protrusion pattern; the passivation layer has a first opening exposing the conductive pad and a passivation protrusion pattern is conformal to the topography of the metal protrusion pattern; the first protection layer has a second opening which exposes the conductive pad through the first opening, and a protection protrusion pattern is conformal to the topography of the passivation protrusion pattern. Further, the PPI structure has a connection line electrically connected to the conductive pad, a landing pad region and a protrusion pattern of PPI structure conformal to the topography of the protection protrusion pattern, in which at least a portion of the protrusion pattern of PPI structure overlaps an area of the landing pad region adjacent to the connection line.

In various embodiments of the present disclosure, the semiconductor device includes a semiconductor substrate, a metallization layer over the semiconductor substrate, a passivation layer over the metallization layer, a protection layer over the passivation layer, and a PPI structure on the protection layer. The metallization layer has a conductive pad and a metal wall. The passivation layer has a first opening exposing the conductive pad and a wall of passivation layer is conformal to the metal wall. The protection layer has a second opening exposing the conductive pad through the first opening, and a wall of protection layer is conformal to the wall of the passivation layer. Further, the protection layer includes a pad region of protection layer surrounded by the wall of passivation layer and exposing the passivation layer. The PPI structure has a connection line electrically connected to the conductive pad, a landing pad region over the pad region of protection layer and a wall of PPI structure is conformal to the wall of protection layer. At least a portion of the wall of PPI structure overlaps an area of the landing pad region adjacent to the connection line. A solder bump on the landing pad region in contact with the protrusion pattern of PPI structure.

According to the embodiments of the present disclosure, no extra cost incurs and improved ball mount accuracy is achieved. Under PPI pad areas, put patterns on lower metal layer and a virtual ball mount boundary is created. To design specific shapes on lower metal layer under PPI pad areas and replace the original design.

Given the above, the present disclosure provides the novel design in manufacturing semiconductor devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
    a semiconductor substrate;
    a metallization layer over the semiconductor substrate, the metallization layer having a conductive pad and a metal protrusion pattern;
    a passivation layer over the metallization layer, the passivation layer having a first opening exposing the conductive pad and a passivation protrusion pattern conformal to the topography of the metal protrusion pattern;
    a protection layer over the passivation layer, the protection layer having a second opening exposing the conductive pad through the first opening, and a protection protrusion pattern conformal to the topography of the passivation protrusion pattern;
    a post-passivation interconnection (PPI) structure on the protection layer, the PPI structure having a connection line electrically connected to the conductive pad, a landing pad region and a protrusion pattern of PPI structure conformal to the topography of the protection protrusion pattern, wherein at least a portion of the protrusion pattern of PPI structure overlaps an area of the landing pad region adjacent to the connection line; and
    a solder bump on the landing pad region in contact with the protrusion pattern of PPI structure.

2. The semiconductor device of claim 1, wherein the protrusion pattern of PPI structure is a round stud in the landing pad region and adjacent to the connection line.

3. The semiconductor device of claim 1, wherein the PPI structure is redistribution lines (RDLs), power lines, or passive components.

4. The semiconductor device of claim 1, wherein the protrusion pattern of PPI structure has a height h1 ranging from 1-3 µm, configured to accommodate the solder bump.

5. The semiconductor device of claim 2, wherein the round stud disposed within the landing pad region.

6. The semiconductor device of claim 5, wherein a protrusion pattern is in a transition area of the landing pad region near the connection line.

7. The semiconductor device of claim 6, wherein the round stud disposed within the landing pad region acts as a curb to prevent the solder bump from wetting an transition area of the landing pad region.

8. The semiconductor device of claim 1, further including at least a second landing pad region.

9. The semiconductor device of claim 1, further including at least a second connection line.

10. The semiconductor device of claim 1, wherein the metallization layer comprises a metal conductive material.

11. The semiconductor device of claim 1, wherein the metallization layer comprises copper, aluminum, copper alloy, or nickel.

12. The semiconductor device of claim 1, wherein the metallization layer is formed using plating, electroless plating, sputtering, chemical vapor deposition.

13. The semiconductor device of claim 1, wherein the metallization layer comprises a nickel-containing layer on top of a copper-containing layer.

14. The semiconductor device of claim 1, wherein the landing pad region and the connection line are formed of a same conductive material.

15. The semiconductor device of claim 1, wherein the passivation layer comprises undoped silicate glass (USG), silicon nitride, silicon oxide, silicon oxynitride or a non-porous material.

16. The semiconductor device of claim 1, wherein the passivation layer is a single layer or a laminated layer.

17. The semiconductor device of claim 1, wherein passivation layer is formed by a chemical vapor deposition (CVD) or physical vapor deposition (PVD) process.

18. The semiconductor device of claim 1, wherein the passivation layer is patterned using a masking process, a lithographic process, an etching process, or a combination thereof, so as to expose a portion of the conductive pad.

19. The semiconductor device of claim 1, wherein the protective layer is a polymer layer.

20. The semiconductor device of claim 19, wherein the polymer layer comprises an epoxy, polyimide, benzocyclobutene (BCB), or polybenzoxazole (PBO).

* * * * *